United States Patent [19]

Suzuki

[11] Patent Number: 5,681,394
[45] Date of Patent: Oct. 28, 1997

[54] PHOTO-EXCITED PROCESSING APPARATUS AND METHOD FOR MANUFACTURING A SEMICONDUCTOR DEVICE BY USING THE SAME

[75] Inventor: Nobumasa Suzuki, Yokohama, Japan

[73] Assignee: Canon Kabushiki Kaisha, Tokyo, Japan

[21] Appl. No.: 110,838

[22] Filed: Aug. 24, 1993

Related U.S. Application Data

[63] Continuation-in-part of Ser. No. 72,858, Jun. 7, 1993, abandoned, which is a continuation of Ser. No. 901,162, Jun. 19, 1992, abandoned.

[30] Foreign Application Priority Data

Jun. 26, 1991 [JP] Japan ..................... 3-181723

[51] Int. Cl.$^6$ ..................................... C23C 16/00
[52] U.S. Cl. ..................... 118/723 R; 118/722
[58] Field of Search ............... 118/722, 723 R, 118/723 MP, 723 E; 156/345; 204/298.11

[56] References Cited

U.S. PATENT DOCUMENTS

| | | | |
|---|---|---|---|
| 4,534,816 | 8/1985 | Chen et al. | 156/345 |
| 4,811,684 | 3/1989 | Tashiro et al. | 118/50.1 |
| 4,994,301 | 2/1991 | Kusumoto et al. | 427/56.1 |
| 5,215,588 | 6/1993 | Rhieu | 427/582 |

OTHER PUBLICATIONS

U.S. Ser. No. 07/901,161 Jun. 19, 1992 Suzuki.

*Primary Examiner*—John Niebling
*Assistant Examiner*—Joni Y. Chang
*Attorney, Agent, or Firm*—Fitzpatrick, Cella, Harper & Scinto

[57] ABSTRACT

A photo-excited processing apparatus includes a reaction chamber to be filled with reaction gas, photo-excitation means for irradiating a light beam from light source means through a light transmissive window formed in the reaction chamber to excite the raw gas, and multi-holed transparent diffusion means arranged between the light transmissive window of the reaction chamber and a substrate to be mounted in the reaction chamber. The multi-holed transparent diffusion means has a diffusion plane on at least one surface thereof having a plurality of holes formed therein and being transparent to the light beam.

2 Claims, 3 Drawing Sheets

PHOTO-EXCITED PROCESSING APPARATUS AND METHOD FOR MANUFACTURING A SEMICONDUCTOR DEVICE BY USING THE SAME

This application is a continuation-in-part of application Ser. No. 08/072,858 filed Jun. 7, 1993 now abandoned, which is a continuation of application Ser. No. 07/901,162 filed Jun. 19, 1992, now abandoned.

BACKGROUND OF THE INVENTION

1. Field of the Invention

The present invention relates to a photo-excited processing apparatus used to manufacture a semiconductor device or an electronic circuit and a method for manufacturing a semiconductor device using the same. More particularly, the present invention relates to an improvement in preventing the reduction of illumination of a light beam from a light source means due to formation of a cloud upon a light transmissive window.

2. Related Background Art

The manufacturing process of a semiconductor device, an electronic circuit and especially VLSI, using a photo-excited processing apparatus principally permits the processing at a low temperature with low damage. For example, it has been applied to cleaning and annealing, and the applications to film forming and etching have been proposed.

In one example of photo-excited processing, a light beam is directed to raw gas filled in a reaction chamber, wherein the raw gas to absorbs a photon of energy, and a thin film is formed on a surface of a substrate, such as a wafer mounted in the reaction chamber by utilizing a so-called photo-excitation caused by photo-decomposition.

In this case, a thin film is also formed on the light transmissive window through which the light beam is directed. This results in clouding of the light transmissive window so that the incident light intensity to the reaction chamber is gradually lowered. Various methods have been proposed in the past to prevent the clouding of the light transmissive window.

FIGS. 3 and 4 are schematic views of prior art photo-excited processing apparatus having an anti-cloud function for the light transmissive window.

FIG. 3 shows a gas purge method. Numeral 31 denotes a light source means which comprises a light source 31a, having a plurality of bar-shaped lamps (31a₁, 31a₂, ...) having long light emission planes normal to the plane of the drawing arranged one-dimensionally a reflector 31b, having a plurality of cylindrical mirrors (31b₁, 31b₂, ...) arranged to have centers of curvature on the light emission line of the light source 31a to reflect the light beams from the light source 31a. Numeral 32 denotes a light transmissive window and numeral 4 denotes a reaction chamber in which raw gas is filled. Numeral 5a denotes purge gas, numeral 5b denotes reaction gas, numeral 6 denotes evacuation gas; numeral 7 denotes a substrate such as a wafer on which a thin film is to be deposited and which is supported by a suscepter 8; numeral 9 denotes a heating means such as a resistive heater which heats the substrate 7; and numeral 34 denotes a separation plate mode of a multi-holed transparent plate which is arranged in a part of the reaction chamber.

The reaction gas 5b absorbs the light beams from the light source means 31 to react to deposit thin films on the substrate 7 and a wall. The diffusion of the gas to the vicinity of the light transmissive window 32 is suppressed by the purge gas 5a and the separation plate 34 so that the deposition of the gas onto the surface 33 of the light transmissive window 32 is suppressed.

FIG. 4 shows only the surrounding area of light source means 41 of a photo-excited processing apparatus. It is intended to prevent the clouding of a light transmissive window 42 when a thin film is to be formed by a so-called grease apply method.

The construction of the light source means 41 is identical to that of the light source means 31 of FIG. 3. Grease is applied to a plane 43 of the light transmissive window 42 which faces a reaction chamber 44. An inorganic thin film used for the semiconductor device is generally hard to deposit on grease. In this manner, the cloud at the time of forming the thin film is prevented.

Of the methods used for preventing the clouding of the light transmissive window, the gas purge method of FIG. 3 does not perfectly purge depending on the pressure. Further, even if the separation plate is transparent, it is clouded by the deposition of the thin film. This causes the reduction and ununiformity of illumination.

In the grease apply method of FIG. 4, the grease evaporated by the light irradiation readily incorporates into the thin film. Thus, when high illumination is used, the grease itself causes the cloud.

SUMMARY OF THE INVENTION

It is an object of the present invention to provide a photo-excited processing apparatus and a method for manufacturing a semiconductor device by using the same. A porous transparent diffusion plate of an appropriate structure is provided in a reaction chamber to reduce the clouding of the light transmissive window and permit the irradiation of a light beam having a high illumination and uniform distribution onto a surface of a substrate in order to enable the formation of a high quality thin film.

DETAILED DESCRIPTION OF THE PREFERRED EMBODIMENTS

Figure 1:
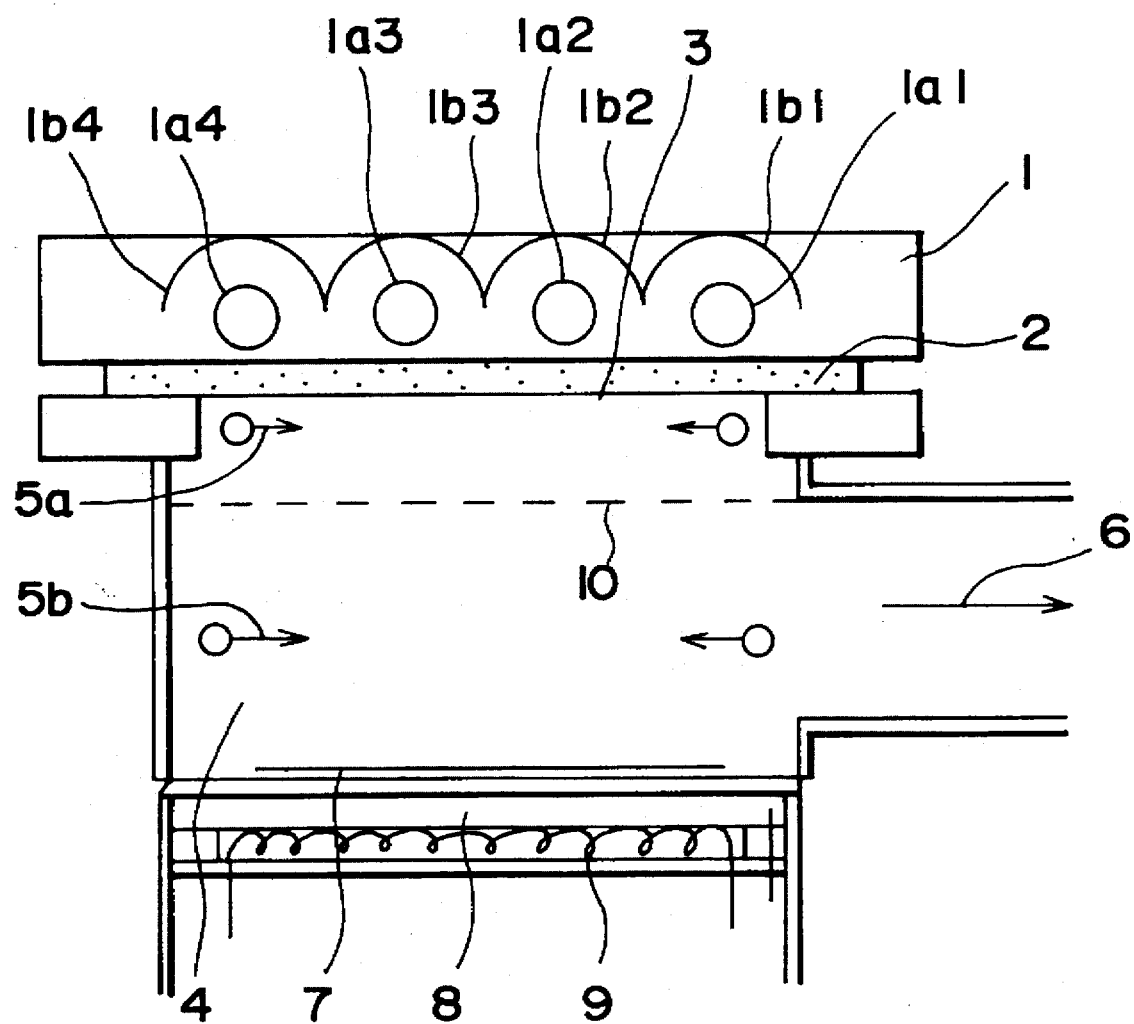
FIG. 1 shows a schematic view of a photo-excited processing apparatus of the present invention.

FIG. 1 shows a schematic view of an embodiment 1 of the photo-excited processing apparatus of the present invention. Numeral 1 denotes light source means. The light source means 1 comprises a light source 1a having a plurality of bar-shaped lamps (1a₁, 1a₂, ... ) having light emission planes extending in a direction perpendicular to the plane of the drawing arranged one-dimensionally and a reflector 1b having a plurality of cylindrical mirrors (1b₁, 1b₂, ... ) arranged to have centers of curvature on the light emission line of the light source 1a to reflect the light beams from the light source 1a.

Numeral 2 denotes a light transmissive window formed in a part of a reaction chamber 4 in which raw gas is filled. Numeral 5a denotes purge gas and numeral 5b denote reaction gas.

Numeral 6 denotes evacuation gas, numeral 7 denotes a substrate such as a wafer which is supported by a suscepter 8, numeral 9 denotes heating means such as a resistive heater which heats the substrate 7, and numeral 10 denotes a multi-holed transparent diffusion plate arranged between the light transmissive window 2 and the substrate 7.

At least one plane of the multi-holed transparent diffusion plate 10 is a diffusion plane having a number of holes and made of a substrate which is transparent to the light beams from the light source means 1. An aperture factor of the holes formed in the multi-holed transparent diffusion plate 10 to an effective area is 10 to 60% in order to effectively prevent the cloud of the light transmissive window 2 as will be discussed later.

The effective area is an area (S) of a portion of the diffusion surface. The aperture factor ($\gamma$) is the ratio of a total area ($\Sigma$) of the multiholes in the diffusion plate to the effective area (S), wherein ($\Sigma$) and (S) are measured in the same units. The percentage value of the aperture hole is ($\gamma$)=($\Sigma$/S)×100. Thus, an area ($\Sigma$) of multiholes is the sum of an area of each hole. The area of each hole can be calculated by the diameter of the hole without any difficulty since the shape of each hole is normally any shape although any shape may be used.

Figure 5A:
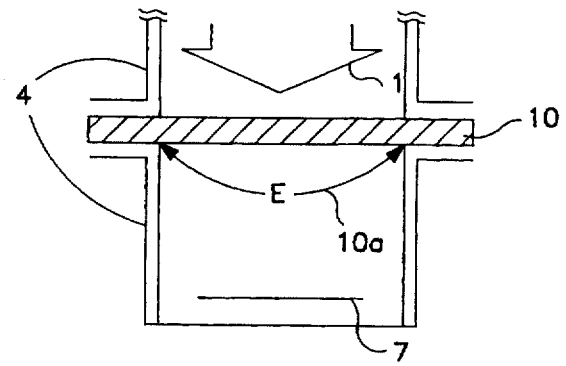
FIG. 5A, FIG. 5B and FIG. 5C shows an object portion directed to an effective area.
Figure 5B:
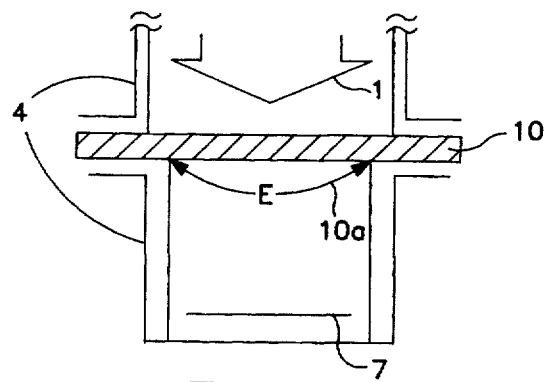
Figure 5C:
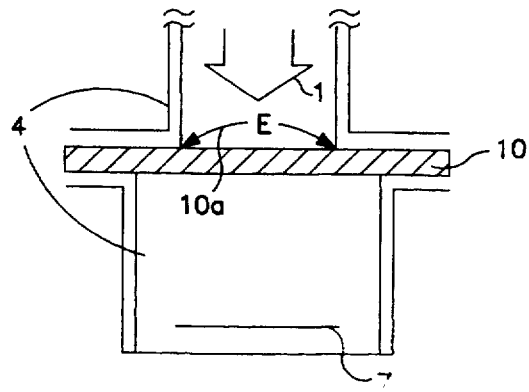

As can be seen from FIGS. 5A–5C an object portion (E) 10a is the "effective area". That is the effective area S corresponds to a cross-sectional area of a smaller chamber portion sandwiching a multi-holed transparent diffusion means 10. Both a circle and a rectangle shape can be applied to the cross-sectional area of the chamber portion. The elements of FIGS. 5A–5C which are the same as those in FIG. 1 are designated by the same numerals.

In the present embodiment, the light beams emitted from the light source means 1 and transmitted through the light transmissive window 2 are diffused by the multi-holed transparent diffusion plate 10 so that the uniformity of illumination on the substrate 7 is improved. The reaction gas 5b absorbs the light beams from the light source means 1 to react to deposit on the substrate 7 and the wall. Diffusion to the vicinity of the light transmissive window 2 is suppressed by the purge gas 5a and the multi-holed transparent diffusion plate 10 so that the deposition to the surface 3 of the light transmissive window is suppressed. Even if a film is deposited on the multi-holed transparent diffusion plate 10 and the scattering of the light due to the unevenness of the film is newly created, the change in the illumination is minimized because the light is scattered by the diffusion plane.

An embodiment for a process of manufacturing a semiconductor device by using the photo-excited processing apparatus of the present embodiment as a photo-CVD apparatus is now explained.

The light source means was a high pressure mercury lamp, and the multi-holed transparent diffusion plate 10 was a synthetic quartz plate having holes of 2 mm diameter at an aperture factor of 30%. The uniformity of illumination on the substrate 7 having a diameter of 6" was ±2% which shows an improvement over the prior art (±5%) having a porous transparent separation plate without a diffusion plane. The purge gas 5a was $N_2$ at 100 sccm and the reaction gas 5b was mixture of $SiH_4$ at 40 sccm and $NH_3$ at 200 sccm. The 5-minute film forming process was conducted 60 times and the transmittance of the light transmissive window was measured. It was approximately 92% at 254 nm which was substantially the same as that prior to the film formation.

A vertical transmittance at a point displaced from the center of the multi-holed transparent diffusion plate 10 by 50 mm was 53% which was only a small change from that prior to the film formation (55%). When a prior art porous transparent separation plate without diffusion plane was used in place of the multi-holed transparent plate 10, the transmittance which was as high as 86% prior to the film formation lowered to 56% after the film formation and the change in the illumination was significant. When the porous transparent diffusion plate 10 is used, the absolute illumination is lower than that attained when the prior art multi-holed transparent separation plate is used, but the uniformity of illumination is improved and the change in the illumination before and after the film formation is reduced. Thus, it is practically superior.

In the present embodiment, a thin film is formed on the substrate (wafer) in the process described above, and an electronic circuit pattern is formed on the wafer 7 and a semiconductor device is fabricated in a known process.

Figure 2:
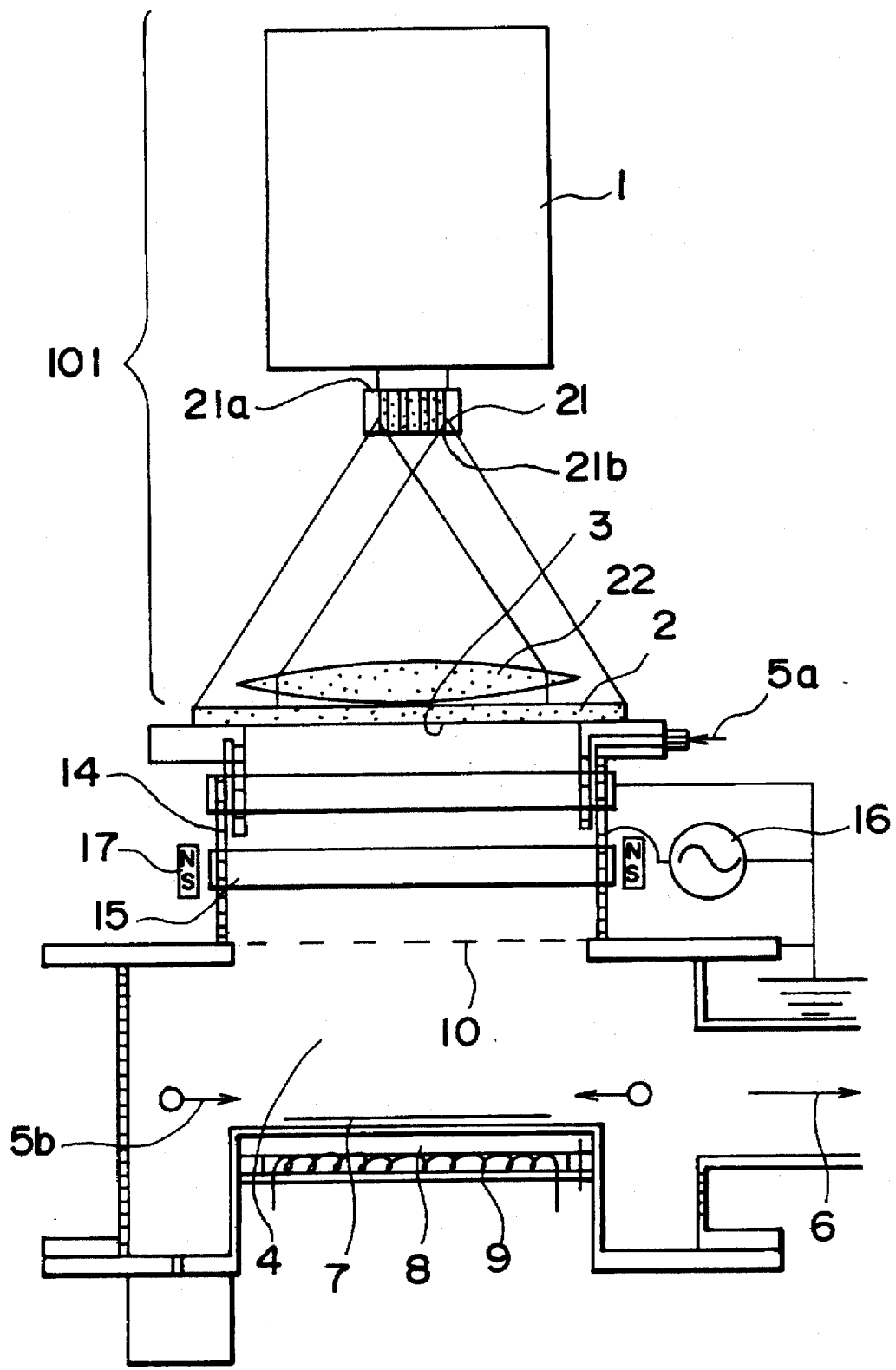
FIG. 2 shows an application of the present invention to a photo-assisted plasma CVD apparatus.
Figure 3:
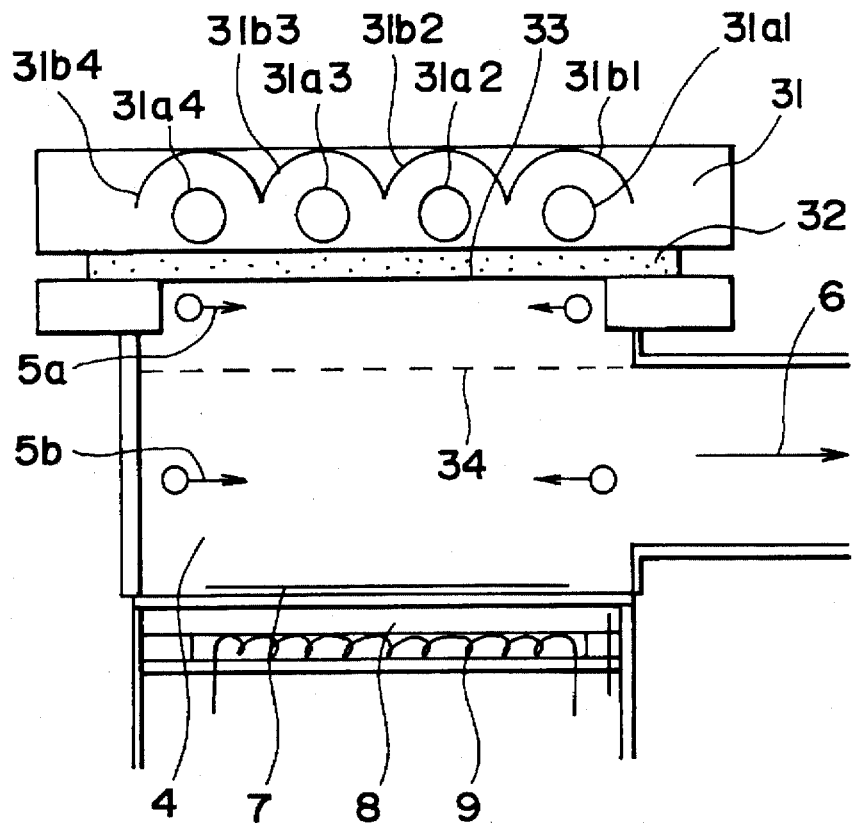
FIG. 3 shows a conventional photo-excited processing apparatus.
Figure 4:
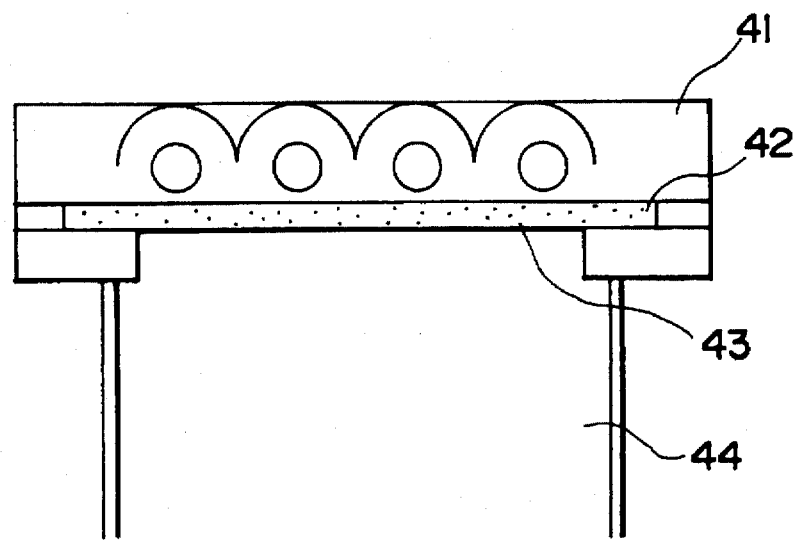
FIG. 4 shows light source means of the conventional photo-excited processing apparatus.

FIG. 2 shows another embodiment of the photo-excited processing apparatus of the present invention. The present embodiment relates to a photo assisted plasma CVD apparatus. In FIG. 2, the like elements to those shown in FIG. 1 are designated by the like numerals.

In FIG. 2, numeral 101 denotes an illumination system, numeral 14 denotes a quartz tube, numeral 15 denotes an RF electrode, numeral 16 denotes an RF power supply which supplies a power to the RF electrode 15, and numeral 17 denotes a magnet which generates a magnetic field normal to an electrical field in the vicinity of the RF electrode 15.

In the present embodiment, the light beams from the light source means 1 are directed to an incident plane 21a of a fly-eye lens (optical integrator) 21 having a plurality of small lenses arranged two-dimensionally. An exit plane 21b of the fly-eye lens 21 is a secondary light source plane of a uniform luminance. The light beams from the exit plane 21b are collimated by a collimate lens 22 and directed to the reaction chamber 4 of the photo-excited processing apparatus in which raw gas is filled, through the light transmissive window 2.

In the present embodiment, the light source means 1 was a Xe lamp. The multi-holed transparent diffusion plate 10 was a fused quartz plate having holes of 2 mm in diameter formed at an aperture factor of 50%. The uniformity of illumination on the substrate 7 having a diameter of 6" was ±2%, which showed an improvement over that (±5%) which was attained by a prior art multi-holed transparent separation plate without diffusion plane. The purge gas 5a was $O_2$ at 2 slm which also acted as the reaction gas, TEOS at 200 sccm was supplied to the reaction chamber 4 as the reaction gas, and the RF power of 1 KW was supplied to the RF electrode 15 to generate a plasma to form a film.

The two-minute film formation was conducted 100 times and the transmittance of the light transmissive window 2 was measured. It was approximately 92% at 365 nm and there was no substantial change from that prior to the film formation. A vertical transmittance at a point displaced from the center of the multi-holed transparent diffusion plate 10 by 50 mm was 61% which was only a small change from that (64%) prior to the film formation. When the prior art multi-holed transparent separation plate without diffusion plate was used in place of the multi-holed transparent diffusion plate 10, the transmittance which was as high as 89% prior to the film formation was lowered to 63% after the film formation and the change in the illumination was significant. When the multi-holed transparent diffusion plate 10 is used, the absolute illumination is lower than that attained by using the prior art multi-holed transparent separation plate but the uniformity of illumination is improved and the change in the illumination before and after the film formation is minimized. Thus, it is practically superior.

In accordance with the present invention, the clouding of the light transmissive window is reduced and the light beams can be irradiated to the substrate with a high illumination and a uniform distribution by providing the porous transparent diffusion plate of the appropriate structure in the reaction chamber, and the photo-excited processing apparatus which permits the formation of high quality thin film and the method for manufacturing the semiconductor device by using the same are attained.

What is claimed is:

1. A photo-excited processing apparatus comprising:

a reaction chamber to be filled with a reaction gas;

photo-excitation means for irradiating light from a light source, through a light transmissive window formed in a part of said reaction chamber, into said reaction chamber; and multi-holed transparent diffusion means arranged between said light transmissive window in said reaction chamber and a substrate to be mounted in said reaction chamber;

said multi-holed transparent diffusion means having a transparent diffusion plate for scattering the light from said light source, said transparent diffusion plate having multiple holes therethrough.

2. A photo-excited processing apparatus according to claim 1 wherein an aperture factor of the holes formed in said multi-holed transparent diffusion means to is set to be within a range from 10% to 60% in relation to an effective area of the diffusion area.

\* \* \* \* \*

UNITED STATES PATENT AND TRADEMARK OFFICE
CERTIFICATE OF CORRECTION

PATENT NO. : 5,681,394

DATED : October 28, 1997

INVENTOR(S) : NOBUMASA SUZUKI

Page 1 of 2

It is certified that error appears in the above-identified patent and that said Letters Patent is hereby corrected as shown below:

<u>IN THE DRAWINGS</u>

Add Figures 5A, 5B and 5C (see attached sheet).

<u>COLUMN 1</u>

Line 31, "to" should be deleted;
    Line 49, "one-dimensionally" should read
           --one-dimensionally;--; and
    Line 56, "gas," should read --gas;--.

<u>COLUMN 3</u>

Line 23, "normally any shape" should read
           --normally circular,--.

<u>COLUMN 6</u>

Line 13, "to" should be deleted.

Signed and Sealed this

Thirteenth Day of October 1998

*Attest:*

BRUCE LEHMAN

*Attesting Officer*

*Commissioner of Patents and Trademarks*